United States Patent [19]

Yamasaki et al.

[11] Patent Number: 4,912,445
[45] Date of Patent: Mar. 27, 1990

[54] ELECTROMAGNET WITH A MAGNETIC SHIELD

[75] Inventors: Akinori Yamasaki; Tatsuya Oue, both of Ako, Japan

[73] Assignee: Mitsubishi Denki Kabushiki Kaisha, Japan

[21] Appl. No.: 298,948

[22] Filed: Jan. 19, 1989

[30] Foreign Application Priority Data

Jan. 22, 1988 [JP] Japan .................................. 63-12852

[51] Int. Cl.$^4$ ............................................. H01F 7/00
[52] U.S. Cl. .................... 335/301; 335/304
[58] Field of Search ............... 335/296, 297, 298, 301, 335/304; 324/318, 319, 320

[56] References Cited

U.S. PATENT DOCUMENTS

| 4,590,452 | 5/1986 | Ries et al. | 335/301 |
| 4,646,046 | 2/1987 | Vavrek et al. | 335/301 |
| 4,673,881 | 6/1987 | Ries et al. | 335/301 X |
| 4,743,880 | 5/1988 | Breneman et al. | 335/301 |

FOREIGN PATENT DOCUMENTS 60-90546  5/1985  Japan .
62-177903 8/1987 Japan .................................. 335/301

Primary Examiner—George Harris
Attorney, Agent, or Firm—Leydig, Voit & Mayer

[57] ABSTRACT

An electromagnet comprising a magnetic field coil and a substantially cylindrical magnetic shield coaxially disposed around the field coil for defining a magnetic circuit therearound. The magnetic shield comprises a hollow cylindrical magnetic yoke with ring-shaped end plates at its opposite ends. The magnetic yoke's cylindrical wall has a cross-sectional area effective for accommodating the magnetic flux generated by the magnetic field coil. The magnetic yoke has a pair of thicker wall sections at first diametrically opposite positions, and a pair of thinner wall sections a second diametrically opposite positions separated by 90 degrees from the first diametrically opposite positions. The thicker and the thinner wall sections are thicker and thinner, respectively, than a mean required wall thickness which is a wall thickness necessary for providing to the magnetic yoke a cross-sectional area for effectively accommodating the magnetic flux generated by the magnetic field coil.

6 Claims, 2 Drawing Sheets

ELECTROMAGNET WITH A MAGNETIC SHIELD

BACKGROUND OF THE INVENTION

This invention relates to an electromagnet and more particularly to an electromagnet with a magnetic shield for generating a highly homogeneous high magnetic field for use in a nuclear magnetic resonance diagnosis system.

In an electromagnet for a nuclear magnetic resonance diagnosis system, a uniform magnetic field of a high intensity of the order of from 0.5 Tesla to 2 Tesla is necessary in an imaging space within an opening of the electromagnet. On the other hand, upon generating such intense magnetic field, a problem that the magnetic field leaks to the exterior of the electromagnet and gives undesirable affects to the surrounding equipment occurs. Therefore, it is customary to enclose the electromagnet with a ferromagnetic member called a magnetic yoke to magnetically shield the electromagnet.

FIGS. 1 and 2 are a sectional view and a sectional side view, respectively, of a conventional electromagnet for a nuclear magnetic resonance diagnosis system put in practical use from the point of view as above discussed.

In these figures, the conventional electromagnet comprises a hollow cylindrical superconducting magnetic field coil 1, a ring-shaped cryogenic vessel 2 for maintaining the magnetic field coil 1 at a cryogenic temperature. The electromagnet also comprises a magnetic shield 3 which is composed of a pair of ring-shaped magnetic end plates 4 with a circular central opening 5 formed therein and a cylindrical yoke 6 of a magnetic material magnetically and mechanically connected at its both end to the end plates 4 so that a magnetic circuit is defined around the magnetic field coil 1.

The magnetic shield 3 must have a cross-sectional area sufficient for accommodating the magnetic flux generated by the magnetic field coil in order to concentrate the magnetic flux to the central region of the electromagnet and to prevent leakage of the magnetic flux. Therefore, the cylindrical magnetic yoke 6 must have a wall thickness of a certain mean value, for a given electromagnet, necessary for providing a neccessary cross-sectional area for effectively accommodating the magnetic flux generated by the magnetic field coil.

Since the conventional electromagnet is constructed as above described, the leakage of the magnetic flux from the nuclear magnetic resonance diagnosis system can be significantly reduced. On the other hand, since the electromagnet for the nuclear magnetic resonance diagnosis system requires to have a highly uniform static magnetic field of the order of 10 ppm within a center sphere of 35 cm in the system, the magnetic shield 3 as well as the magnetic field coil 1 must be very precisely configured and positioned. The magnetic field coil 1 and the magnetic shield 3 generate a magnetic gradient which deteriorates the uniformity of the magnetic field when they are asymmetric with respect to the coil center and the coil axis, so that the magnetic field coil 1 and the magnetic shield 3 are coaxially disposed and arranged in symmetry also with respect to the longitudinal central axis of the magnetic field coil 1.

On the other hand, in an example shown in FIGS. 3 and 4 which is the one disclosed in Japanese Paten Laid-Open No. 60-90546, the electromagnet has a magnetic shield 7 which comprises four rectangular magnetic yokes 8 arranged at equal intervals between polygonal end plates 9 for the purpose of providing connecting side openings for the evacuating pump for the cryogenic vessel through the spaces between the magnetic yokes 8. This arrangement can be considered as an example in which there is no magnetic yoke positioned in the widthwise direction of the electromagnet.

With such the arrangement, magnetic reluctance of the magnetic path for the magnetic flux greatly varies from position to position because of the discontinuity of the magnetic yokes in the circumferential direction, so that, in order to realize a highly uniform magnetic field in the imaging space within the electromagnet for the nuclear magnetic resonance diagnosis system, it is necessary to increase the correction value of the separately provided magnetic field correction coil. This requires an increased power and additional provision of a correction coil. Also, the magnetic shielding effect of the magnetic shield 7 is relatively small.

While the conventional electromagnet is constructed as above described, as a stronger magnetic field of a higher uniformity is required, an increased ferromagnetic plate thickness for the magnetic shield is required, and the overall dimensions of the electromagnet are becoming as large as 2.5 m (width) ×2.5 m (height) ×2.5 m (length). In particular, in the case of the nuclear magnetic resonance diagnosis system, the system is often installed in a hospital or the like, where the space in which the system is installed is not necessarily large because of various reasons.

Also, when this system is to be additionally installed in an already-built building, problems arise such that the passage for carrying the electromagnet into the diagnosis room is too narrow in width as compared to height or the diagnosis room has too small floor area as compared to ceiling height, so that the carrying and installing are very difficult.

SUMMARY OF THE INVENTION

Accordingly, an object of the present invention is to provide an electromagnet with a magnetic shield which has smaller diametrical dimension.

Another object of the present invention is to provide an electromagnet which maintains the necessary uniformity of the magnetic field while being adapted to the dimensional limitation of the installation space and the passageway therefor.

Still another object of the present invention is to provide an electromagnet which is suitable for use in a nuclear magnetic resonance diagnosis system.

With the above objects in view, the electromagnet of the present invention comprises a magnetic field coil and a substantially cylindrical magnetic shield coaxially disposed around the field coil for defining a magnetic circuit therearound. The magnetic shield comprises a hollow cylindrical magnetic yoke with ring-shaped end plates at its opposite ends. The magnetic yoke's cylindrical wall has a cross-sectional area effective for accommodating the magnetic flux generated by the magnetic field coil. The magnetic yoke has a pair of thicker wall sections at first diametrically opposite positions, and a pair of thinner wall sections a second diametrically opposite positions separated by 90 degrees from the first diametrially opposite positions. The thicker and the thinner wall sections are thicker and thinner, respectively, than a mean required wall thickness which is a wall thickness necessary for providing to the magnetic yoke a cross-sectional area for effectively accommodating the magnetic flux generated by the magnetic field coil.

According to the electromagnet of the present invention, since the yoke plate thickness of the widthwise dimension of the electromagnet is made thin and the yoke plate thickness at other portion is made thick, the widthwise dimension of the electromagnet can be made small, enabling the electromagnet to be carried into an installation space through a carrying path and the installation space can be decreased.

BRIEF DESCRIPTION OF THE DRAWINGS

The present invention will become more readily apparent from the following detailed description of the preferred embodiments of the present invention taken in conjunction with the accompanying drawing, in which.

DESCRIPTION OF THE PREFERRED EMBODIMENTS

Figure 1:
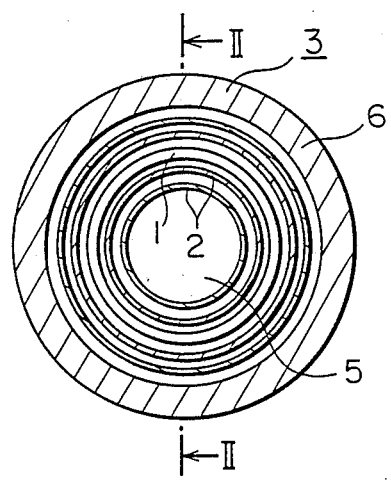
FIG. 1 is a cross-sectional view of an electromagnet of the conventional design taken along line I—I of FIG. 2.
Figure 2:
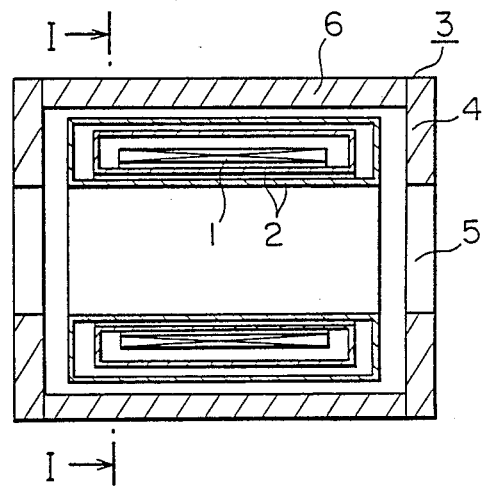
FIG. 2 is a sectional side view of the electromagnet shown in FIG. 1 taken along line II—II of FIG. 1.
Figure 3:
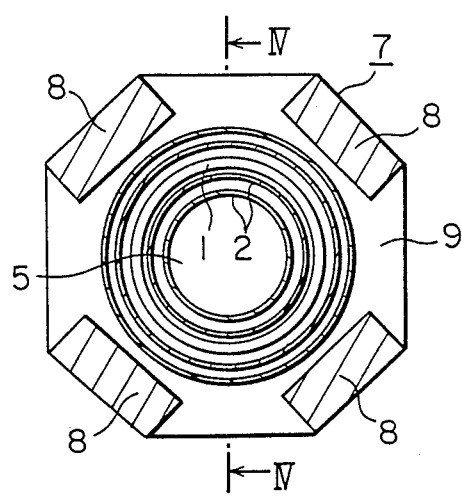
FIG. 3 is a cross-sectional view of an electromagnet of another conventional design taken along line III—III of FIG. 4.
Figure 4:
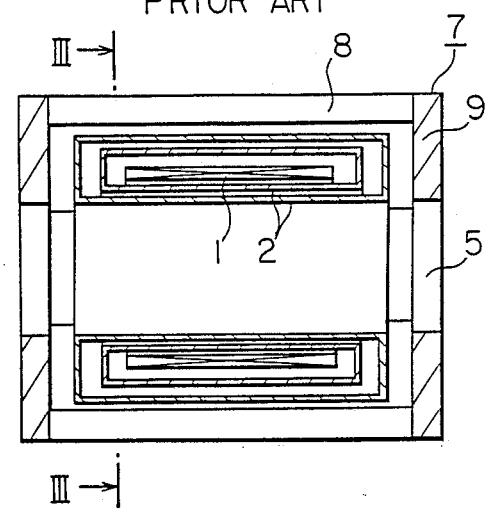
FIG. 4 is a sectional side view of the electromagnet shown in FIG. 3 taken along line IV—IV of FIG. 3.
Figure 5:
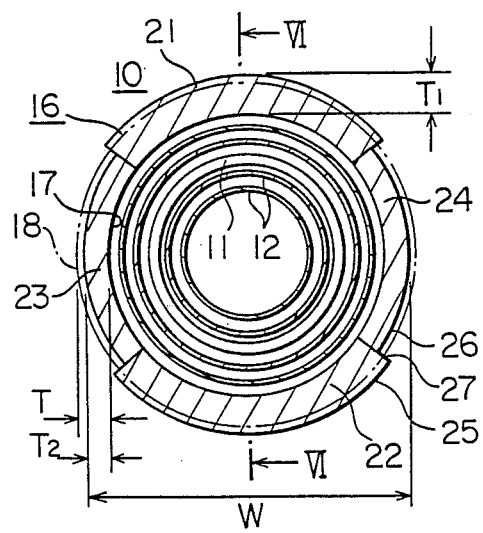
FIG. 5 is a cross-sectional view of one embodiement of the electromagnet of the present invention taken along line V—V of FIG. 6 in which the magnetic yoke comprises four curved wall sections of different thickness.
Figure 6:
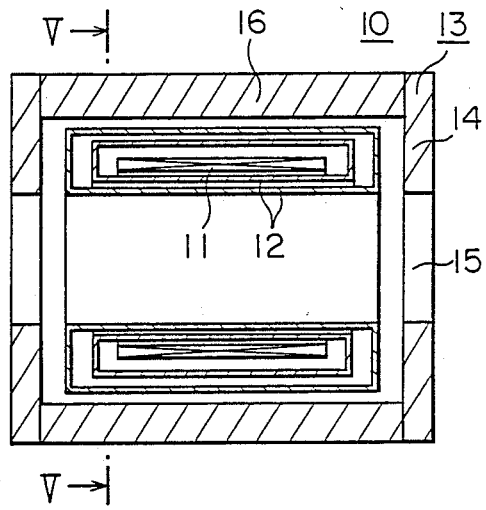
FIG. 6 is a longitudinal sectional side view of the electromagnet of the present invention shown in FIG. 5 taken along line VI—VI of FIG. 5.

FIGS. 5 and 6 illustrate one embodiment of an electromagnet 10 of the present invention which comprises a hollow cylindrical superconducting magnetic field coil 11. The magnetic field coil 11 is contained within a cryogenic vessel 12 for maintaining the magnetic field coil 11 at a cryogenic temperature.

The electromagnet 10 of the present invention also comprises a substantially cylindrical magnetic Shield 13 coaxially disposed around the magnetic field coil 11. The magnetic shield 13 is composed of a pair of ring-shaped magnetic end plates 14 disposed about the opposite ends of the magnetic field coil 11 with a circular central opening 15 formed therein and a hollow cylindrical magnetic yoke 16 of a magnetic material magnetically and mechanically connected at its both ends to the end plates 14 so that a magnetic circuit is defined around the magnetic field coil 11.

As shown in FIGS. 5 and 6, the magnetic yoke 16 of the present invention is continuous and substantially cylindrical. As previously discussed, the magnetic yoke 16 must have a cross-sectional area effective for accommodating the magnetic flux generated by the magnetic field coil 11, and the mean required wall thickness for this particular magnetic yoke 16 of the electromagnet 10, which is a wall thickness of the cylindrical magnetic yoke 16 necessary for providing a cross-sectional area for effectively accommodating the magnetic flux generated by the magnetic field coil 11, is shown as being a mean required wall thickness T. This thickness T is a distance between the inner cylindrical surface 17 of the magnetic yoke 16 and a mean outer diameter 18 which is an imaginary circle coaxial with the inner surface 17 and having a diameter greater than the inner surface 17 by the mean required wall thickness T.

The magnetic yoke 16 of this embodiment has four wall sections 21, 22, 23 and 24 each extending about 90 degrees along the circumference. The first two wall sections 21 and 22 make an identical pair in that they have the same first wall thickness $T_1$ larger than the mean required wall thickness T. The first wall section pair 21 and 22 are positioned at diametrically opposite positions or at the positions separated by 180 degrees from each other. The second two wall sections 23 and 24 make another identical pair of the same second wall thickness $T_2$ which is smaller than the mean required wall thickness T. These second wall section pair 23 and 24 are positioned at second diametrically opposite positions separated by 90 degrees from the first diametrical positions so that they are circumferentially inserted between the first pair 21 and 22. The four wall sections 21-4 are welded together along their axial edges to provide the inner surface 17 which is cylindrical and smooth. An outer surface of the magnetic yoke 16 has a raised surface 25 and a lowered surface 26 connected by steps 27.

In the illustrated embodiment, the electromagnet 10 is oriented so that the thicker first wall sections 21 and 22 define the top and the bottom walls of the magnetic yoke 16 and that the thinner second wall sections 23 and 24 define the side walls of the magnetic yoke 16. Therefore, the width dimension W of the electromagnet 10 is smaller than those of the conventional design shown in FIGS. 1 to 4.

The optimum ratio of the thickness $T_1$ of the first wall sections 21 and 22 relative to the thickness $T_2$ of the second wall sections 23 and 24 is determined by analyzing the magnetic field, with the extent and the precision of the uniformity of the magnetic field intensity and the properties of the magnetic material for the magnetic yoke 16 taken into consideration.

Thus, according to the present invention, since the thickness of the magnetic yoke 16 is thin in the width direction of the electromagnet 10, the widthwise dimension W of the electromagnet 10 is smaller than that of the conventional design such as those shown in FIGS. 1 to 4. Therefore, the electromagnet 10 of the present invention can be carried through a narrow entrance way and can be installed in a small installation space. Also, since the wall sections 21-24 of different thickness of the magnetic yoke 16 are disposed in a diametrically opposed relationship or in symmetry with respect to the coil center and the coil axis, and since the magnetic yoke 16 has no discontinuity, adverse affect of locally reducing the thickness of the magnetic yoke 16 on the uniformity of the magnetic field generated in the electromagnet 10 is small.

In order to evaluate the present invention, an electromagnet of the configuration as shown in FIGS. 5 and has been built and tested. The magnetic shield 13 had the end plate 14 of 165 mm thick, and the magnetic yoke 16 composed of the first wall sections 21 and 22 of 210 mm thick and the second wall sections 23 and 24 of 100 mm thick, the overall width W of the magnetic shield 13 was 2,000 mm. The test data indicated that the electromagnet 10 had a highly uniform magnetic field of not more than 10 ppm within center sphere of 35 cm when a central magnetic field of 1.5 Tesla is generated. The leakage of the magnetic field also did not exceed the prescribed value.

Figure 7:
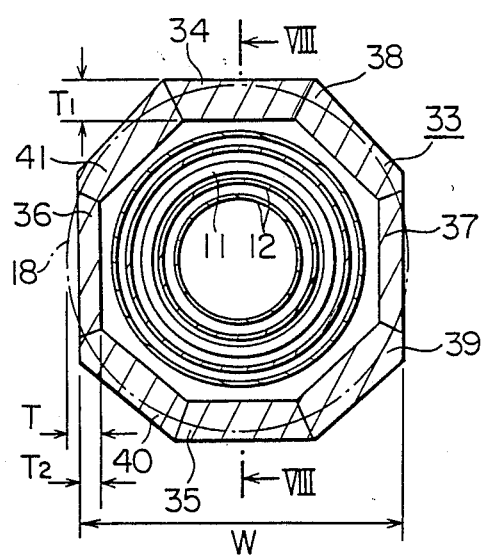
FIG. 7 is a cross-sectional view of another embodiment of the electromagnet taken along line VII—VII of FIG. 8 in which the magnetic yoke comprises eight flat wall sections of different thickness.
Figure 8:
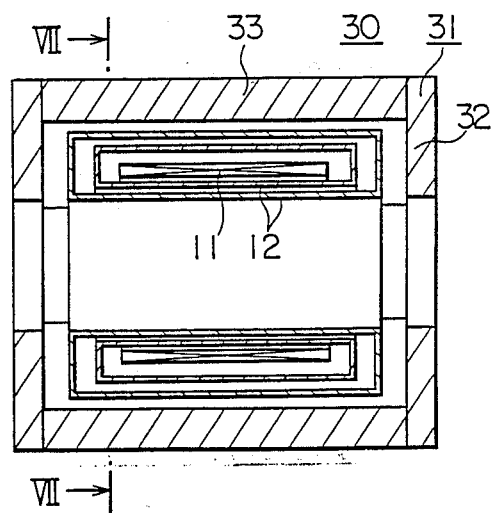
FIG. 8 is a longitudinal sectional view of the electromagnet shown in FIG. 7 taken along line VIII—VIII of FIG. 7.

FIGS. 7 and 8 illustrate another embodiment of the present invention, in which an electromaget 30 comprises a magnetic shield 31 having an eight-sided end plate 32 and a magnetic yoke 33 composed of eight substantially flat wall sections 34–41. As in the previous embodiment shown in FIGS. 5 and 6, the top and the bottom wall sections 34 and 35 are thicker ($T_1$) than the mean required thickness T (FIG. 5) and the side wall sections 36 and 37 are thinner ($T_2$) than the mean required thickness T. It is seen that the magnetic yoke 33 comprises four transition wall sections 38–41 inserted between the above-mentioned four wall sections 34–37 for mechanically and magnetically connecting them into a continuous, substantially cylindrical configuration in which the first and the second wall sections 34–37 as well as four transition wall sections 38–41 each extend over about 45 degrees in the circumferential direction.

As has been described above, according to the present invention, the wall thickness of the tubular magnetic yoke of the electromagnet is relatively thin in side walls an the wall thickness of the magnetic yoke is relatively thick at top and bottom walls and an necessary overall magnetic circuit cross-sectional area is maintained, and the wall sections of different thickness are symmetrically disposed with respect to the coil center and the coil axis. Therefore, the electromagnet of the present invention has a width dimension smaller than that of the conventional design and still provides a highly uniform magnetic field of a sufficient magnitude.

What is claimed is:

1. An electromagnet comprising:
   a magnetic field coil; and
   a substantially cylindrical magnetic shield disposed substantially coaxially around said magnetic field coil for defining magnetic circuit therearound;
   said magnetic shield comprising;
   a pair of substantially ring-shaped end plates disposed at the opposite ends of said magnetic field coil; and
   a substantially cylindrical hollow magnetic yoke magnetically connected at its opposite ends to said end plates;
   said magnetic yoke having a continuous, substantially cylindrical wall having a cross-sectional area effective for accommodating said magnetic flux generated by said magnetic field coil;
   said magnetic yoke having a pair of first wall sections of a first wall thickness at first diametrically opposite positions, said first wall thickness being larger than a mean required wall thickness, which is a wall thickness necessary for providing a cross-sectional area for effectively accommodating the magnetic flux generated by said magnetic field coil, and a pair of second wall sections of a second wall thickness smaller than said mean wall thickness at second diametrically opposite positions separated by 90 degrees from said first diametrical positions about the axis of said magnetic coil.

2. An electromagnet as claimed in claim 1, wherein said first and said second wall sections each extends over about 90 degrees.

3. An electromagnet as claimed in claim 2, wherein said first and said second wall sections are curved plates.

4. An electromagnet as claimed in claim 1, wherein said cylindrical magnetic yoke comprises four transition wall sections for connecting said first and said second wall sections each extending over about 45 degrees.

5. An electromagnet as claimed in claim 4, wherein said first and said second wall sections as well as said transition wall sections are substantially flat plates.

6. An electromagnet as claimed in claim 1, wherein said pair of said second wall sections is positioned in the horizontal direction.

* * * * *